(12) United States Patent
Hwang et al.

(10) Patent No.: US 7,189,302 B2
(45) Date of Patent: Mar. 13, 2007

(54) MULTI-LAYER PRINTED CIRCUIT BOARD AND FABRICATING METHOD THEREOF

(75) Inventors: Jung-Ho Hwang, Gyeonggi-Do (KR); Sung-Gue Lee, Gyeonggi-Do (KR); Sang-Min Lee, Gyeonggi-Do (KR); Joon-Wook Han, Gyeonggi-Do (KR); Tae-Sik Eo, Gyeonggi-Do (KR); Yu-Seock Yang, Seoul (KR)

(73) Assignee: LG Electronics Inc., Seoul (KR)

( * ) Notice: Subject to any disclaimer, the term of this patent is extended or adjusted under 35 U.S.C. 154(b) by 0 days.

(21) Appl. No.: 10/981,778

(22) Filed: Nov. 5, 2004

(65) Prior Publication Data
US 2005/0098347 A1    May 12, 2005

(30) Foreign Application Priority Data
Nov. 6, 2003    (KR) .................... 10-2003-0078472

(51) Int. Cl.
C25D 11/08    (2006.01)
C25D 5/02    (2006.01)
B29C 65/00    (2006.01)

(52) U.S. Cl. ................ 156/289; 156/150; 205/125; 427/96.1; 174/255

(58) Field of Classification Search ........... 205/125; 156/150, 154, 289; 427/96.1, 97.1, 97.4–97.6; 29/829, 849; 174/255, 264; 257/499
See application file for complete search history.

(56) References Cited

U.S. PATENT DOCUMENTS 3,791,858 A *  2/1974  McPherson et al. ....... 430/314
5,600,103 A     2/1997  Odaira et al. ............. 174/265
6,528,874 B1    3/2003  Iijima et al. ............. 257/700
6,551,433 B2 *  4/2003  Kuwako et al. ........... 156/230
6,652,962 B1 *  11/2003 Sato et al. ............... 428/352
6,921,451 B2 *  7/2005  Wilheim .................. 156/247

FOREIGN PATENT DOCUMENTS

JP    08-204333    8/1996
JP    2001-111189    4/2001

OTHER PUBLICATIONS

Chinese Office Action w/ English Translation.

* cited by examiner

*Primary Examiner*—Nam Nguyen
*Assistant Examiner*—Luan V. Van
(74) *Attorney, Agent, or Firm*—Fleshner & Kim, LLP

(57) ABSTRACT

A fabricating method for a multi-layer printed circuit board is provided. The method may include attaching a releasing film at upper and lower surfaces of a center layer and attaching a first metal film to each of the releasing films and a resist layer to each of the first metal films to form a base member. A first connection portion may then be formed on each of the first metal films, and a second connection portion may be integrally formed on each of the first connection portions. A second metal film may then be formed on each of the second connection portions so as to be electrically connected to the connection portions, and, in turn, to the first metal films. Specific portions of the second metal films may be etched to form copper patterns. Upper and lower portions may then be separated by the releasing films to form separate multi-layer printed circuit boards.

5 Claims, 11 Drawing Sheets

MULTI-LAYER PRINTED CIRCUIT BOARD AND FABRICATING METHOD THEREOF

BACKGROUND OF THE INVENTION

1. Field of the Invention

The present invention relates to a multi-layer printed circuit board and a fabricating method thereof, and more particularly, to a multi-layer printed circuit board having copper patterns at an upper surface and a lower surface thereof and having a connection portion for electrically connecting the copper patterns therein, and a fabricating method thereof.

2. Description of the Conventional Art

Generally, a printed circuit board is variously used in electronic devices or electronic goods, and becomes multi-layered and high-densified as the electronic industry is developed. At the time of fabricating the printed circuit board, many processes and precise technique are required.

Copper patterns are formed at an upper surface and a lower surface of the multi-layer printed circuit board, and a connection portion for electrically connecting the copper patterns is formed at the printed circuit board in a vertical direction or a laminated direction.

As one example of the connection portion, a technique for using an anisotropy conductive adhesive was disclosed. According to the anisotropy conductive adhesive formed by dispersing minute conductive particles in an adhesion sheet, when a certain pressure is applied to the conductive adhesive in a vertical direction, the part to which the pressure has been applied selectively shows a conductivity and this characteristic of the anisotropy conductive adhesive was used for the connection portion.

Also, a technique for forming a hole at a printed circuit board and then plating an inner circumferential surface of the hole thereby electrically connecting copper patterns formed at an upper surface and a lower surface of the printed circuit board was disclosed.

According to the Korean patent No. 203, 540 (U.S. Pat. No. 5,600,103), as shown in FIG. 1, conical conductive wiring parts 2' are positioned in an inter-connector 1 with penetrating a synthetic resin based sheet 4. A lower portion of the conical conductive wiring parts 2' is electrically connected to copper patterns 3, and an upper portion of the conical conductive wiring parts 2' is used as a connecting terminal with an exposed state from the surface of the synthetic resin based sheet 4. The conductive wiring parts 2 are formed with a certain height accordingly as a conductive paste is repeatedly printed on the copper pattern 3 by a screen printing method. Then, the synthetic resin based sheet 4 is positioned on the conductive wiring parts 2 and is compressed by a roller, etc., so that the conductive wiring parts 2 are protruded out by penetrating the synthetic resin based sheet 4.

According to the Japanese Laid-Open Publication Patent No. 2001-111189 (U.S. Pat. No. 6,528,874), as shown in FIG. 2A, a base member 10 that an etching resist layer 13 of a nickel material is interposed between a first copper layer 11 and a second copper layer 12 is provided. The first copper layer 11 is to be served as a connection portion 16 in the next process, and is formed to be thicker than the second copper layer 12. The second copper layer 12 is to be served as a copper pattern 19 in the last process.

As shown in FIGS. 2B and 2C, resist layers 14 and 14' are formed at both surfaces of the base member 10, and a specific part of the resist layer 14' positioned at the first copper layer 11 where the connection portion 16 is to be formed is removed thereby to form an etching opening 15. A part of the first copper layer 11 exposed through the etching opening 15 is etched thereby to be removed, and the first copper layer 11 that has not been removed forms the conical connection portion 16. The connection portion 16 is formed as a cone shape by an etching factor. The second copper layer 12 is not etched by an etching resist layer 13 and the upper resist layer 14.

As shown in FIGS. 2D and 2E, the resist layer 14 of FIG. 2C is removed, then a prepreg film 17 is attached to the end of each connection portion 16, and then the prepreg film 17 is pressurized by a roller (not shown) thereby to position between each connection portion 16.

As shown in FIG. 2F, a third copper layer 18 is connected to the end of the prepreg film 17 and the connection portion 16 by a pressing.

As shown in FIG. 2G, copper patterns 19 are respectively formed at the upper and lower surfaces of the base member 10. According to this, the copper patterns 19 are electrically connected one another by the connection portion 16.

However, the conventional fabricating method for a printed circuit board has the following problems.

First, the conventional fabricating method for a printed circuit board using an anisotropy conductive adhesive is not suitable for a printed circuit board requiring a low resistance.

Second, in the conventional fabricating method for a printed circuit board, a hole has to be formed by a perforation at the printed circuit board and a plating has to be performed at the inner circumferential surface of the hole thereby to have very complicated processes.

Third, according to the conventional fabricating method for a printed circuit board disclosed in the Korean Patent No. 203, 540, a conductive wiring part (a connection portion) has to be formed with a certain height by repeatedly printing a conductive paste several times, and the conductive wiring part has to be formed at a precise position thereby to have a complicated entire process and thus to lower a production yield. Since a diameter of a lower portion of the conductive wiring part is relatively larger than a diameter of an upper portion thereof, a gap between the conductive wiring parts becomes increased and thereby the printed circuit board can not be minimized.

Fourth, according to the conventional printed circuit board disclosed in the Japanese Laid-Open Publication Patent No. 2001-11189, the first copper layer 11 has to be relatively thicker in order to form the connection portion 16 with a certain height, and many parts of the first copper layer 11 are unnecessarily consumed in order to form the connection portion 16. At the time of etching the connection portion 16, a diameter of the end of the connection portion 16 becomes smaller than a diameter of a bottom portion thereof. Therefore, a gap between adjacent connection portions 16 has to be properly obtained in order to constantly form the diameter of the end of the connection portion 16, thereby having a difficulty in forming a minute circuit pattern.

Also, a thickness of the second copper 12 is less than 20 μm and a thickness of the first copper layer 11 for forming the connection portion 16 is approximately 100 μm, so that the second copper layer 12 is bent at the time of dealing with the base member 10 after forming the connection portion 16.

Also, if a height of the connection portion 16 finally required is 60 μm, for example, a thickness of the first copper layer 11 has to be more than approximately 100 μm with consideration of a loss due to an etching, a loss due to a pressurization, etc. According to this, a material loss is entirely increased.

SUMMARY OF THE INVENTION

Therefore, an object of the present invention is to provide a printed circuit board capable of forming a connection portion having a higher reliability by simpler and easier processes and capable of enhancing a workability and a production yield, and a fabricating method thereof.

To achieve these and other advantages and in accordance with the purpose of the present invention, as embodied and broadly described herein, there is provided a fabricating method of a printed circuit board comprising the steps of: attaching a releasing film to upper and lower surfaces of a center layer, attaching a first metal film to the releasing film, and attaching a first dry film to a surface of the first metal film thereby forming a base member; removing specific parts of the first dry film by separation liquid and thereby respectively forming a first plate opening at the removed parts; forming a first plate layer on the first metal film exposed through the first plate opening of each first dry film so as to be electrically connected to each other; grinding each first plate layer as much as a certain thickness; removing each first dry film and thereby forming a first connection portion; laminating an insulating material on the surface of the first metal film where the first connection portion is formed, and then heating and pressuring the insulating material thereby forming a first insulating layer where the first connection portion passes; depositing a second dry film on a surface of each first insulating layer; removing a part of each second dry film corresponding to the first connection portion, and thereby forming a second plate opening; forming a second plate layer at the end of each first connection portion exposed through the second plate opening; grinding each second plate layer as much as a certain thickness; removing each second dry film and thereby forming a connection portion that the first connection portion and a second connection portion are integrally formed; laminating an insulating material on a surface of each first insulating layer and then forming a second insulating layer through which the connection portion passes; forming a second metal film on a surface of the second insulating layer so as to be electrically connected to the connection portion; cutting both end portions of the releasing film in a vertical direction of the base member thereby dividing the printed circuit board into two parts; and removing a specific part of each second metal film thereby respectively forming copper patterns on a surface of the second insulating layer so as to be electrically connected to the connection portion.

To achieve these and other advantages and in accordance with the purpose of the present invention, as embodied and broadly described herein, there is also provided a printed circuit board comprising: insulating layers; circuit patterns formed at metal films provided at upper and lower surfaces of the insulating layers; and a connection portion for electrically connecting the circuit pattern formed at one metal film to the circuit pattern formed at another metal film by passing through the insulating layers, and composed of a first connection portion and a second connection portion formed as a cylindrical shape and having a different diameter each other, wherein a diameter of the second connection portion is smaller than a diameter of the first connection portion at a part where the first connection portion and the second connection portion are connected to each other.

The foregoing and other objects, features, aspects and advantages of the present invention will become more apparent from the following detailed description of the present invention when taken in conjunction with the accompanying drawings.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENTS

Reference will now be made in detail to the preferred embodiments of the present invention, examples of which are illustrated in the accompanying drawings.

Hereinafter, a multi-layer printed circuit board according to the present invention will be explained with reference to the attached drawings as follows.

Figure 1:
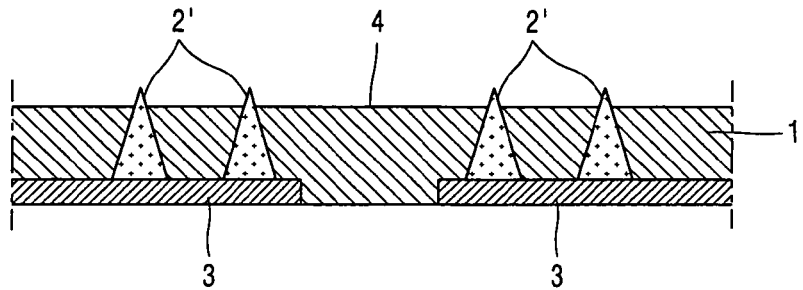
FIG. 1 is a flow chart showing a fabricating method for a printed circuit board according to one embodiment of the conventional art.
Figure 2A:
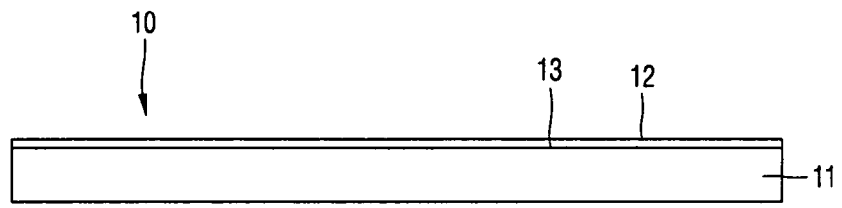
FIGS. 2A to 2G are flow charts showing a fabricating method for a printed circuit board according to another embodiment of the conventional art.
Figure 2B:
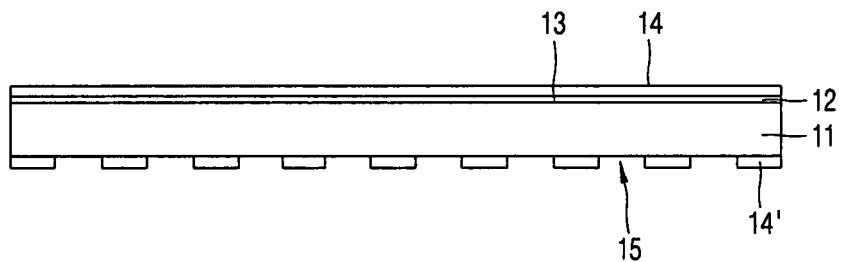
Figure 2C:
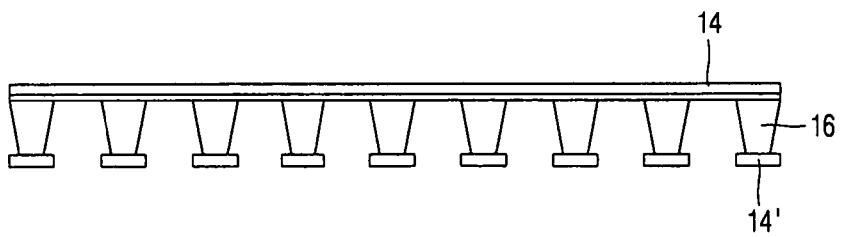
Figure 2D:
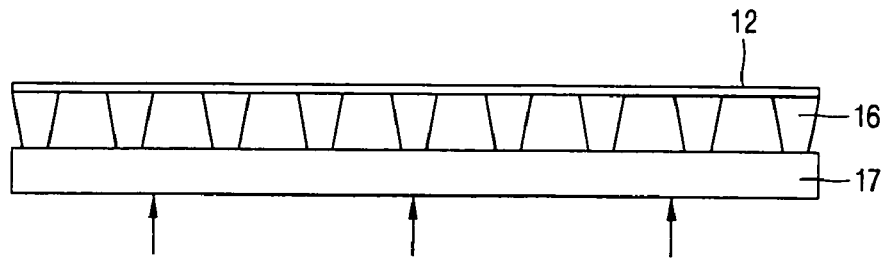
Figure 2E:
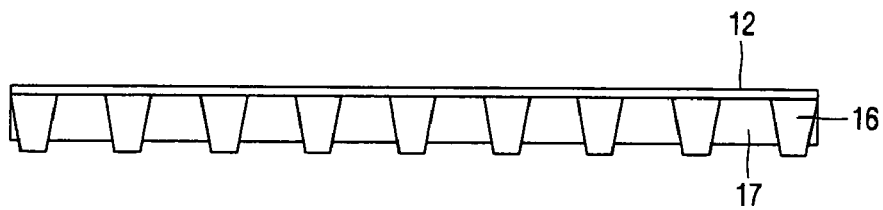
Figure 2F:
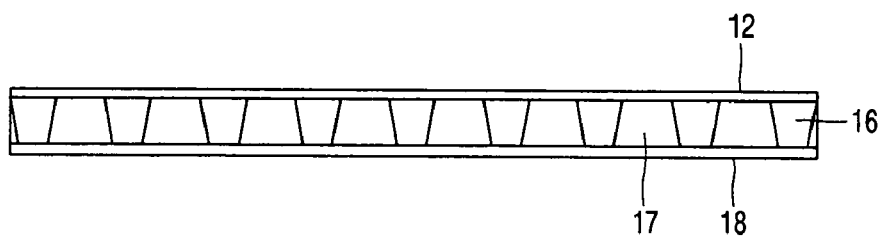
Figure 2G:
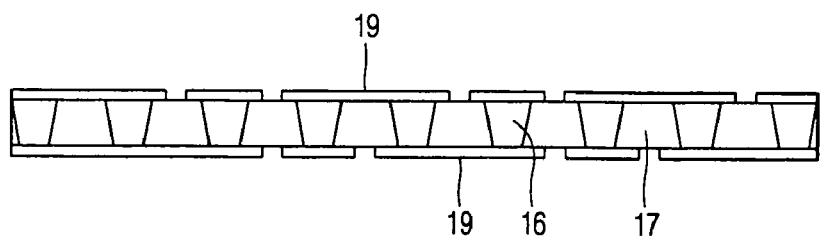
Figure 3A:
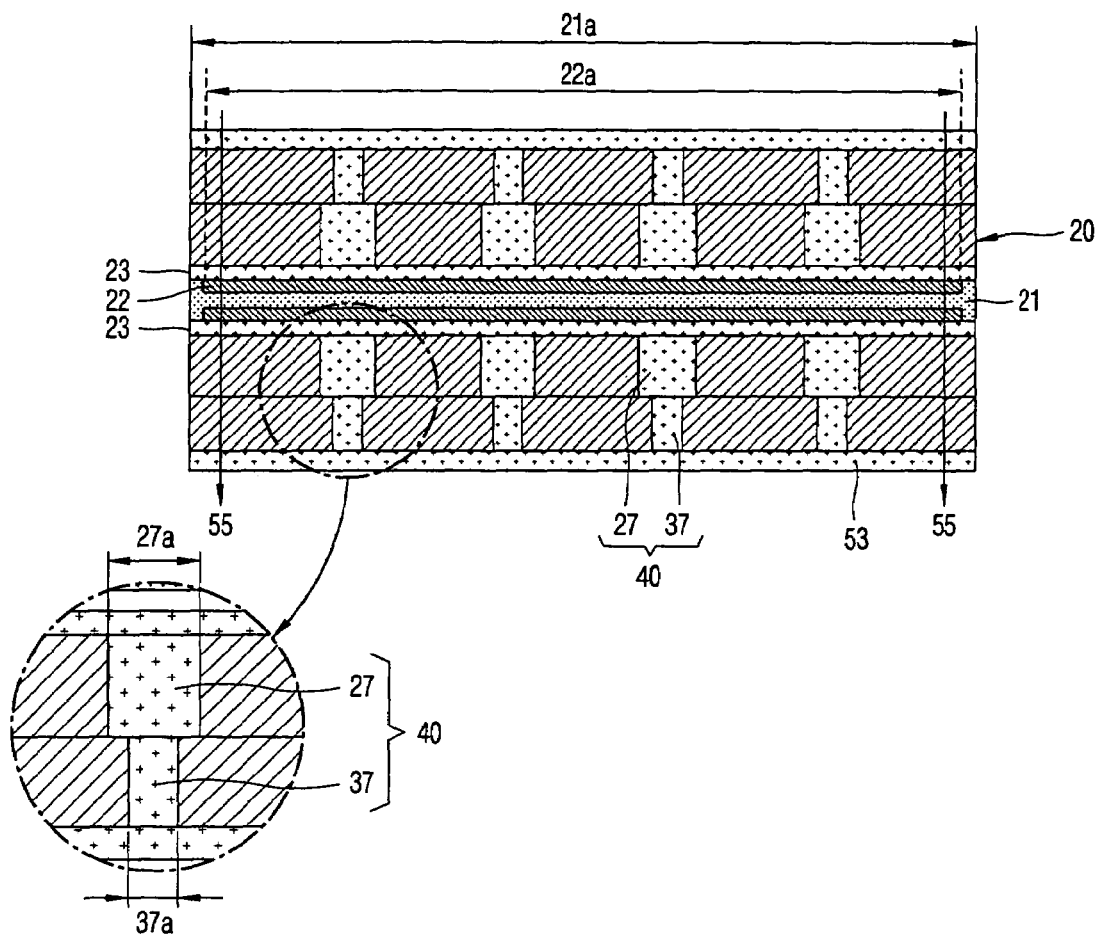
FIG. 3A is a longitudinal section view showing a printed circuit board prior to a completion in a multi-layer printed circuit board according to the present invention.
Figure 3B:
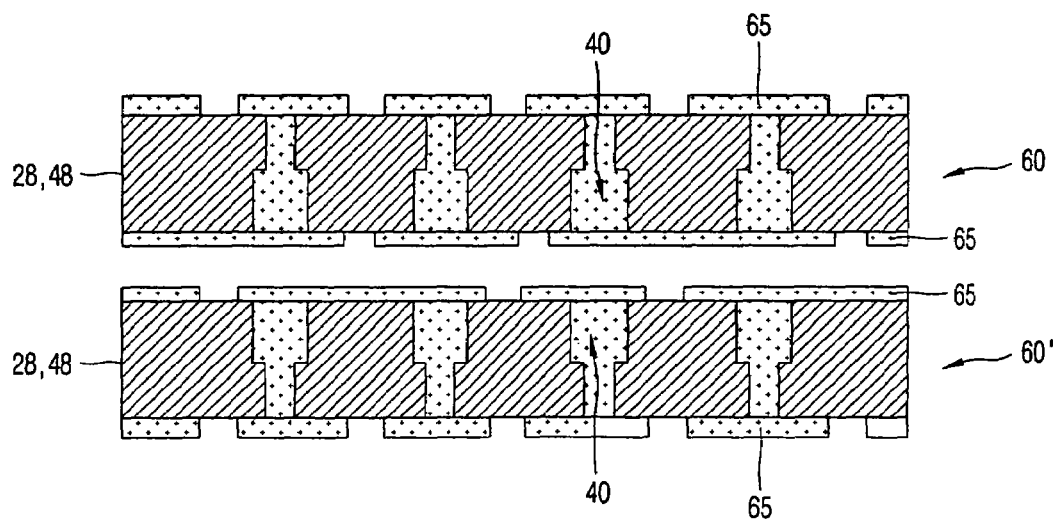
FIG. 3B is a longitudinal section view showing a completed printed circuit board in the multi-layer printed circuit board according to the present invention.

FIG. 3A is a longitudinal section view showing a printed circuit board prior to a completion in a multi-layer printed circuit board according to the present invention, and FIG. 3B is a longitudinal section view showing a completed printed circuit board in the multi-layer printed circuit board according to the present invention.

As shown in FIG. 3A, releasing films 22 are facing to each other in a center layer 21 of a base member 20, and a first metal film 23 is attached to a surface of each releasing film 22. The first metal film 23 is preferably formed of a copper foil. However, any material having a good conduction property can be used.

A first connection portion 27 is formed on a surface of each first metal film 23 by an electrolytic electroplating, a second connection portion 37 is integrally formed on a surface of the first connection portion 27 by an electrolytic electroplating, and a second metal film 53 is formed on a surface of each second connection portion 37. By a connection portion 40 composed of the first connection portion 27 and the second connection portion 37, the first metal film 23 and the second metal film 53 are electrically connected to each other.

In the present invention, as shown in FIG. 3B, an upper printed circuit board 60 and a lower printed circuit board 60' on the basis of a center layer 21 are simultaneously fabricated by a series of processes.

As aforementioned, the releasing film 22 is mounted in the base member 20. A length 22a of the releasing film 22 is formed to be shorter than a length 21a of the center layer 21.

Both end portions of the releasing film 22 are cut in a vertical direction of the base member 20, a direction indicated as a cutting line 55, and then the releasing film 22 is removed. According to this, two printed circuit boards 60 and 60' on the basis of the center layer 21 are formed.

Then, the first metal film 23 and the second metal film 53 formed on the: surface of each printed circuit board are etched thus to form copper patterns 65, thereby completing the printed circuit boards 60 and 60'.

In the printed circuit board of the present invention, the copper patterns 65 formed at the upper and lower surfaces of the printed circuit board are electrically connected to each other by the connection portion 40. The connection portion 40 is formed by a copper plating process.

The connection portion 40 is composed of the first connection portion 27 and the second connection portion 37 integrally formed with the first connection portion 27. In order to facilitate to fabricate the connection portion, a diameter 37a of the second connection portion 37 is preferably formed to be smaller than a diameter 27a of the first connection portion 27.

A fabricating method for a multi-layer printed circuit board according to the present invention comprises the steps of: attaching a releasing film 22 to upper and lower surfaces of a center layer 21, and attaching a first metal film 23 to a surface of the releasing film 22 thereby forming a base member 20; forming a first connection portion 27 on a surface of each first metal film 23 by an electroplating process to be electrically connected to each other; forming a connection portion 40 where the second connection portion 37 is integrally formed with the first connection portion 27 on a surface of the first connection portion 27 by an electroplating process; forming a second metal film 53 on a surface of each second connection portion 37 so as to be electrically connected to the connection portion 40; and etching a specific part of each second metal film 53 thereby forming copper patterns 65.

Figure 4A:
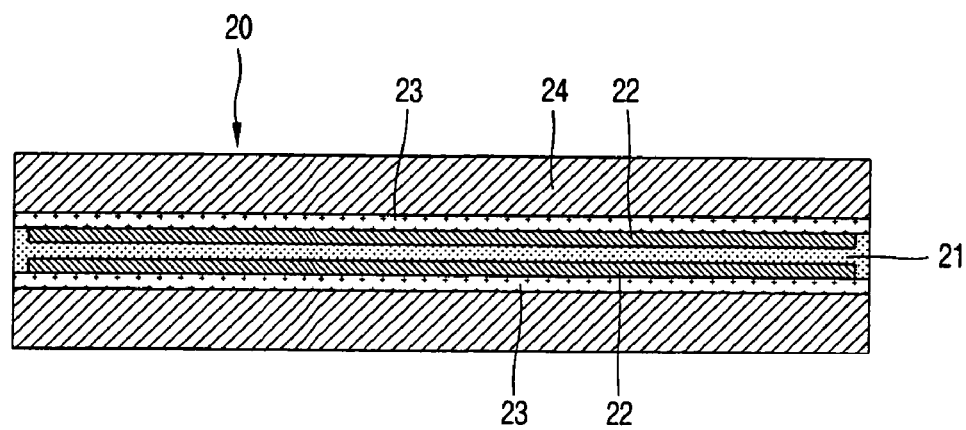
FIGS. 4A to 4O are flow charts showing a fabricating method for the multi-layer printed circuit board according to the present invention.
Figure 4B:
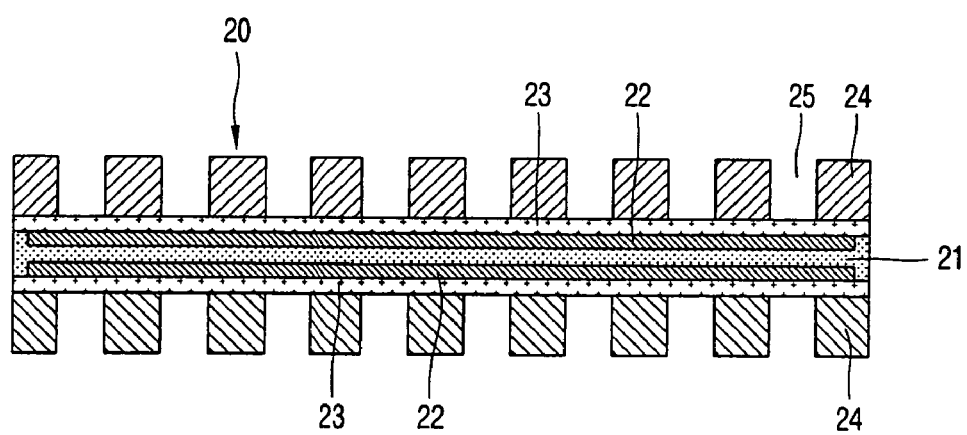
Figure 4C:
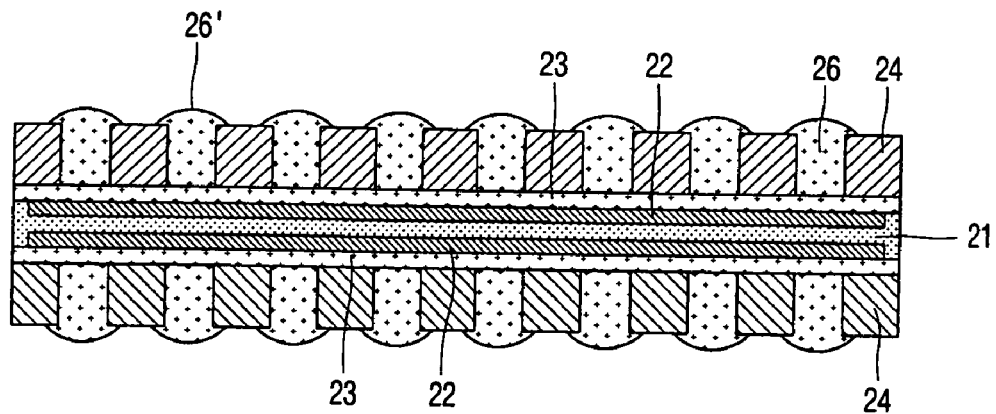
Figure 4D:
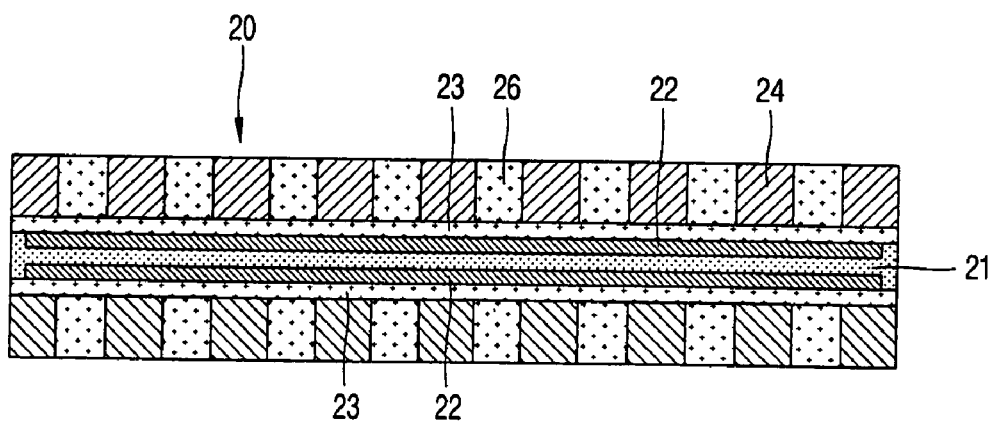
Figure 4E:
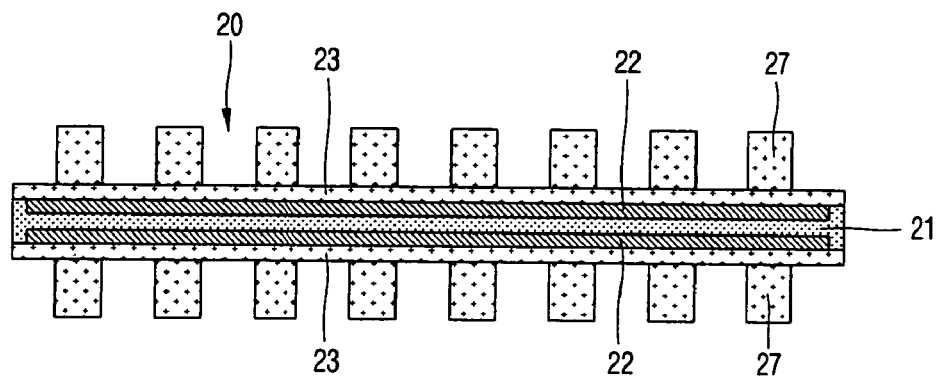
Figure 4F:
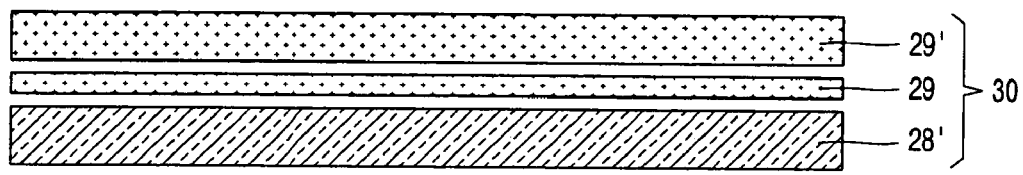
Figure 4F:
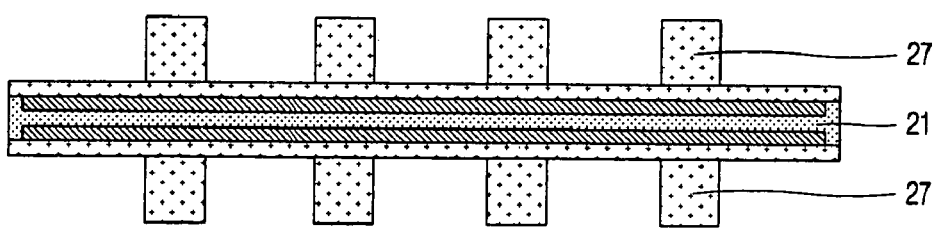
Figure 4F:
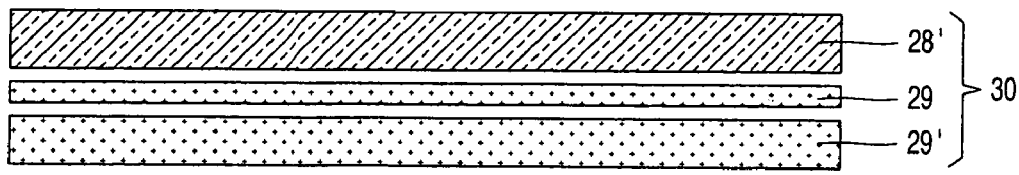
Figure 4G:
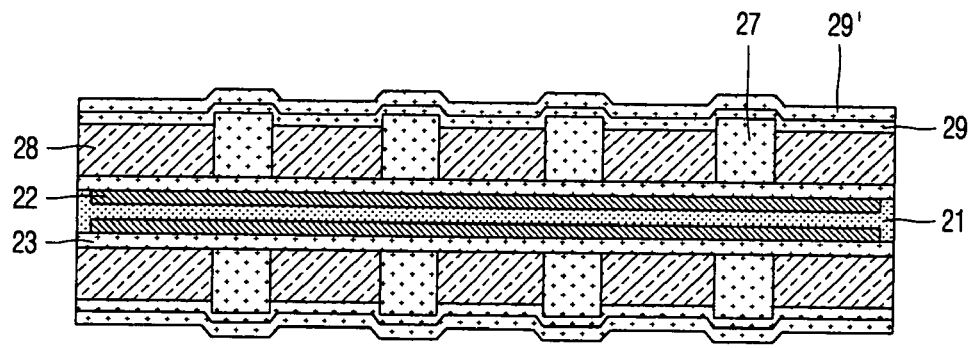
Figure 4H:
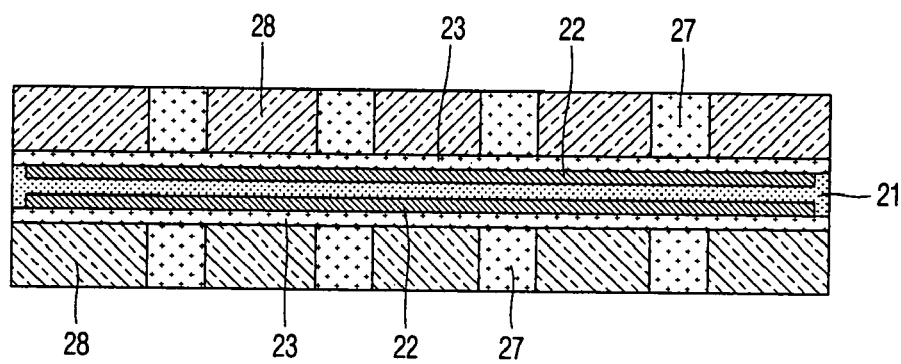
Figure 4I:
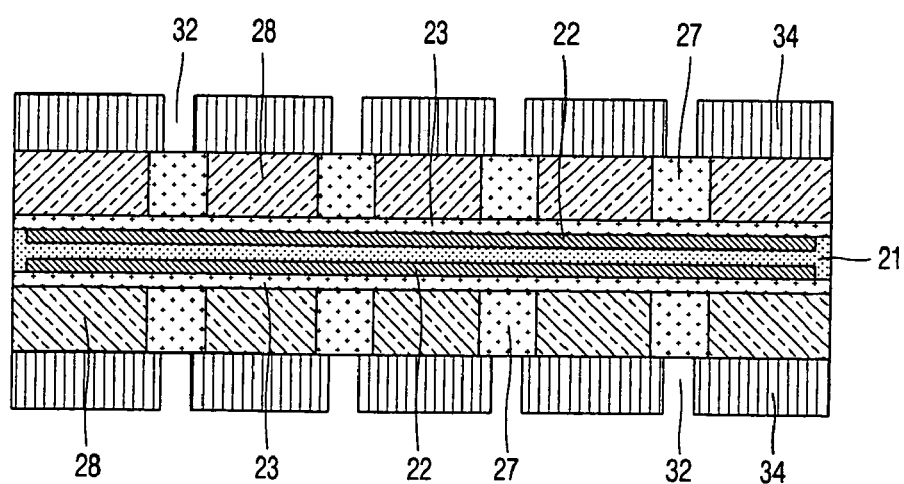
Figure 4J:
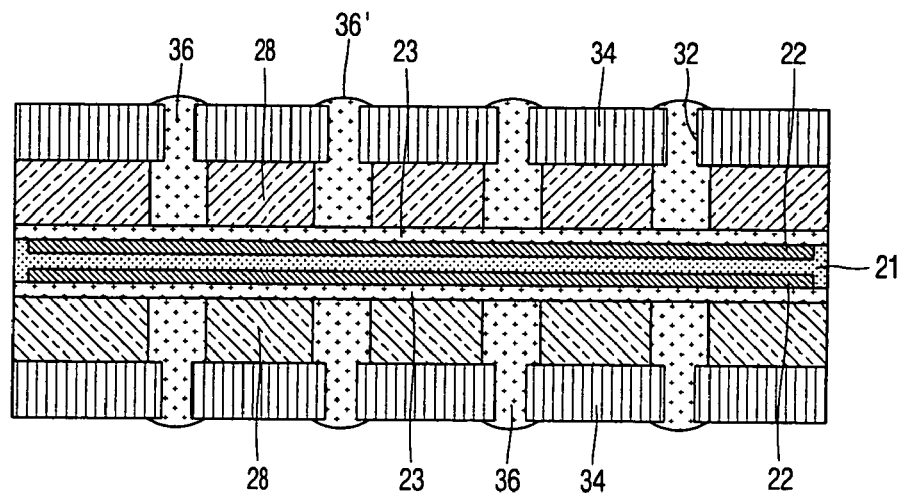
Figure 4K:
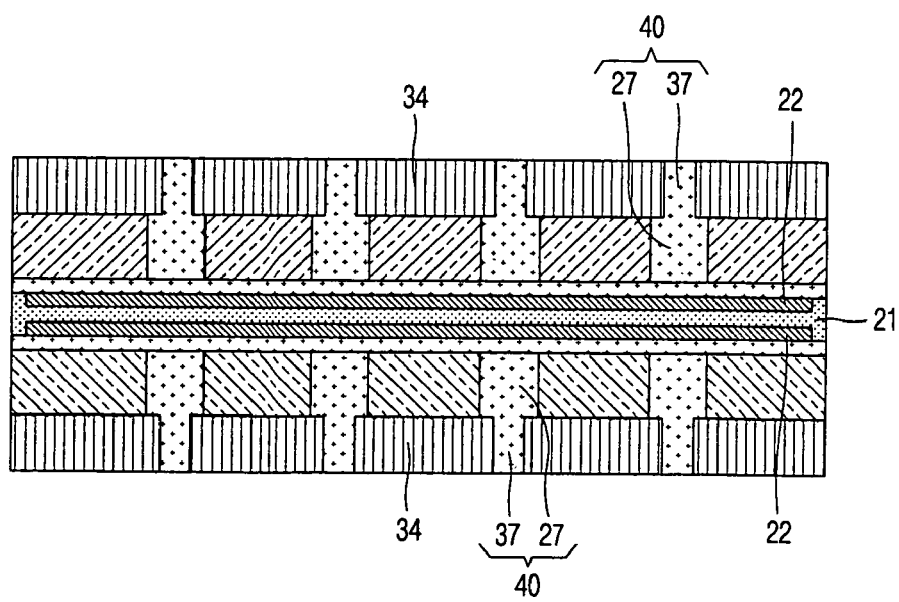
Figure 4L:
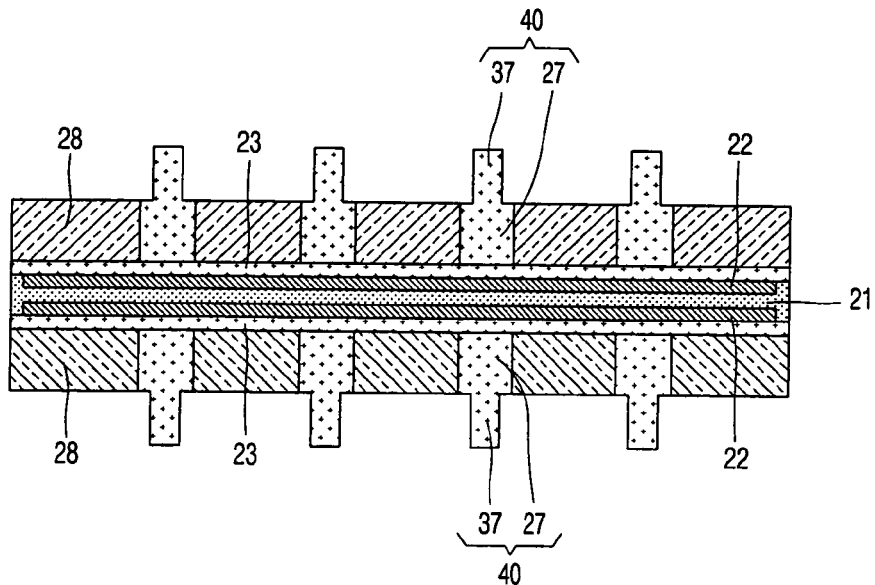
Figure 4M:
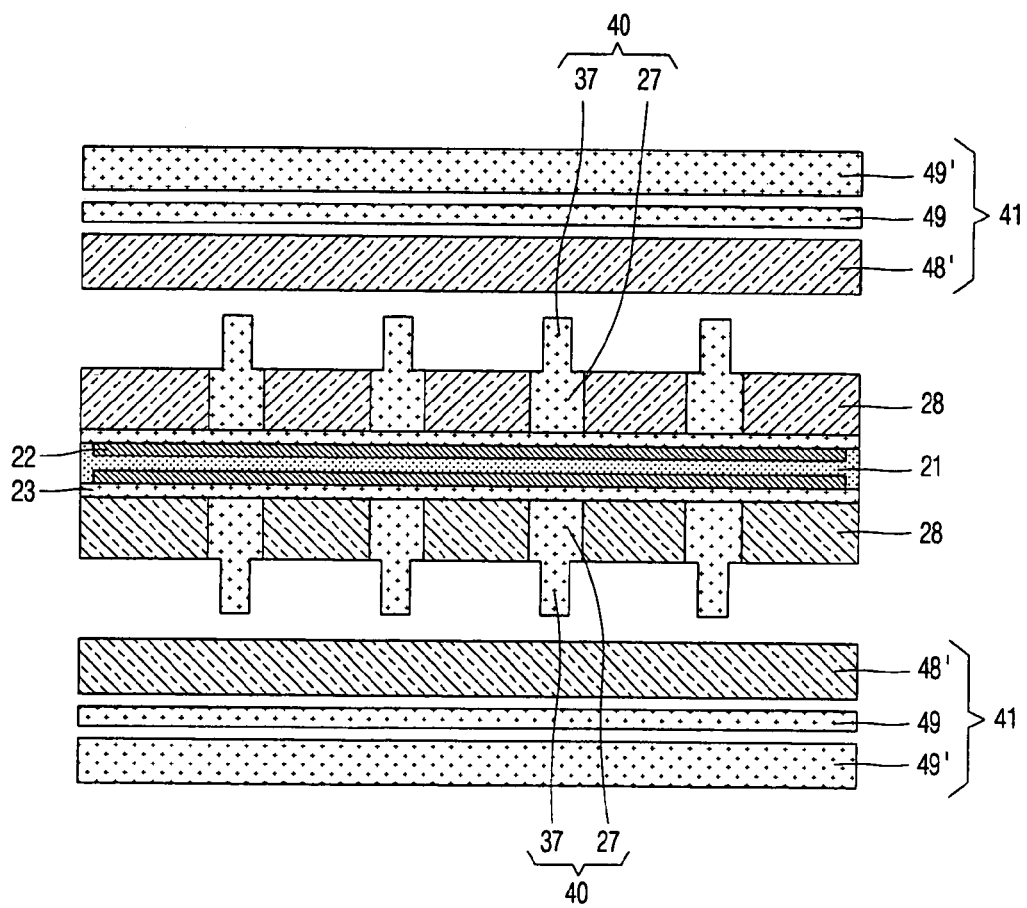
Figure 4N:
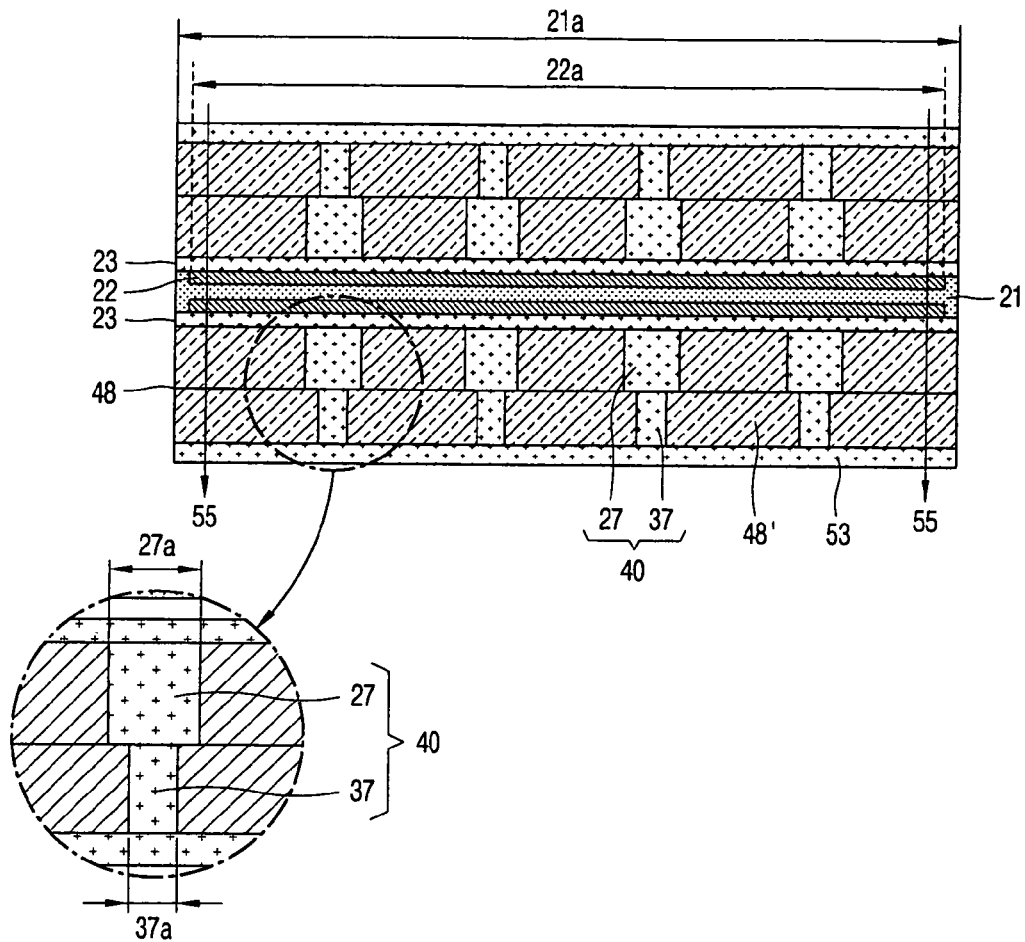
Figure 4O:
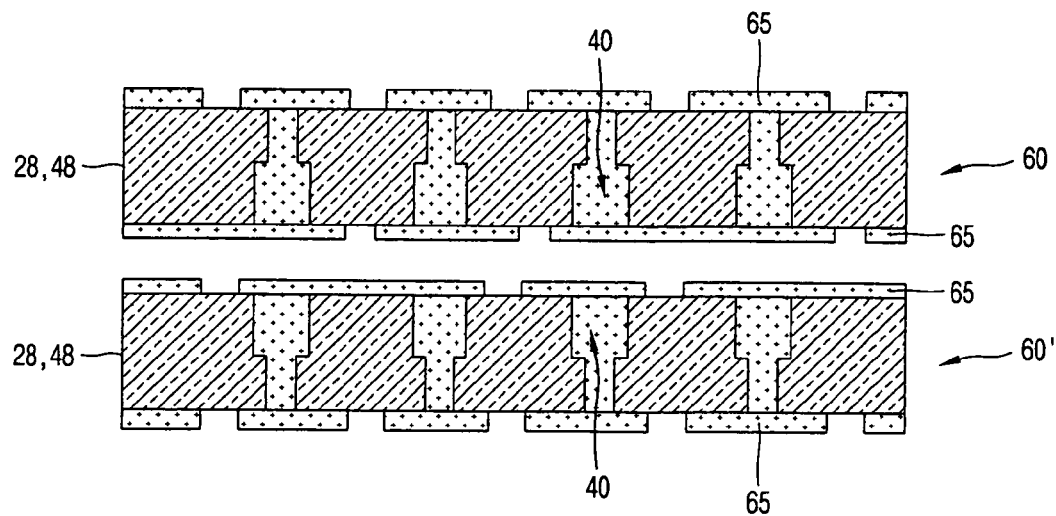

FIGS. 4A to 4O are flow charts showing a fabricating method for the multi-layer printed circuit board according to the present invention. Hereinafter, the fabricating method for a printed circuit board according to the present invention will be explained with reference to FIGS. 4A to 4O.

As shown in FIG. 4A, a releasing film 22 is positioned at upper and lower surfaces of a center layer 21 thereby to attach a first metal film 23 on the releasing film 22. Then, a first dry film 24, an etching resist layer is attached to a surface of each first metal film 23 thereby to form a base member 20.

As shown in FIG. 4B, specific parts of each first dry film 24 are removed by separation liquid, and then a first plate opening 25 is respectively formed at the removed parts.

As shown in FIGS. 4C and 4D, a first plate layer 26 is formed on the surface of each first metal film 23 exposed through the first plate opening 25 of each first dry film 24 by a copper electroplating to be electrically connected to the first metal film 23. Then, a protrusion portion 26' of each first plate layer 26 is removed in a grinding process thereby to grind as much as a certain thickness.

The protrusion portion 26' protruded to an upper surface of the first dry film 24 is removed by a grinding, and at the same time, an upper surface of the first plate layer 26 has the same height as the upper surface of the dry film 24. According to this, the first plate layer 26 is formed as a cylindrical shape that, a diameter of a lower surface is the same as a diameter of an upper surface. The first plate layer 26 can be formed not only as a cylindrical shape but also as a triangular prism shape, a square prism shape, etc.

As shown in FIG. 4E, each first dry film 24 of FIG. 4D is removed by separation liquid thereby to form a first connection portion 27.

As shown in FIG. 4F, a first insulating member 28', a first passivation film 29, and a second passivation film 29' are sequentially laminated on the surface of each first metal film 23 thereby to form a lamination body 30. As a material of the first insulating member 28', polyimide resin, resin, or prepreg can be used. Then, the laminated body 30 is positioned at a pressing device (not shown), and is heated and pressurized. According to this, the first insulating member 28' is being soft between each first connection portion 27, and the first connection portion 27 penetrates the first insulating member 28' thereby to form a first insulating layer 28 as shown in FIG. 4G.

As shown in FIG. 4H, the second passivation film 29' is removed, and the first insulating layer 28 and the first connection portion 27 are flat with a same height by a grinding.

The grinding process can be variously in various states. First, the grinding process can be performed in a state that the second passivation film 29' is removed. In this case, it is preferable not to use the first passivation film 29 in the previous process.

Also, the grinding process can be performed in a state that only the second passivation film 29' is removed and the first passivation film 29 is positioned at an outer side of the first passivation film 29. In this case, if the first passivation film 29 is removed after the grinding process, the first connection portion 27 is more protruded out of the passivation film 29 than the first insulating layer 28.

Under this state, a copper thin film (not shown) is adhered to the surface of the base member 20, and the center layer 21 of the base member 20 is separated thereby to form a printed circuit board through a circuit pattern forming process.

The first passivation film 29 protects the first insulating layer 28 at the time of a grinding process.

The second passivation film 29' uniformly transmits a pressing force of a pressing device to the first insulating member 28'. That is, when the device (not shown) presses the lamination body 30, the end of the first connection portion 27 is uniformly in contact with the first insulating member 28'. Under this state, the end of the first connection portion 27 easily penetrates the first insulating member 28', so that the first insulating layer 28 is uniformly filled between each first connection portion 27.

As a material of the first passivation film 29, an OPP film is preferably used. A thickness of the first passivation film 29 is preferably 30~35 μm, and a thickness of the second passivation film 29' is preferably approximately 100 μm.

As shown in FIG. 4I, a second dry film 34 is deposited on the surface of each first insulating layer 28, and then a specific part of each second dry film 34, that is, a part corresponding to the first connection portion 27 is removed by separation liquid thereby to form a second plate opening 32 at the removed part.

At this time, a diameter of the second plate opening 32 is preferably formed to be smaller or equal than or to a diameter of the first connection portion 27, that is, a degree that an outer side of the first connection portion 27 can be exposed to the outside through the second plate opening 32.

As shown in FIG. 4J, a second plate layer 36 is integrally formed on the surface of each first connection portion 27 exposed through the second plate opening 32 by a copper electrolytic plating. The second plate 36 is a part to become the second connection portion 37 in the next process. A plate protrusion 36' more protruded to an outer side of the second dry film 34 is formed at the upper end of the second plate layer 36. The second plate layer 36 formed at the second plate opening 32 has a cylindrical shape, and the plate protrusion 36' is formed as a mushroom shape.

As shown in FIG. 4K, the protrusion 36' is ground as much as a certain thickness by using a brush (not shown) in order to remove the protrusion 36' of each second plate layer 36 of FIG. 4J.

The grinding is performed so that the thickness of each second plate layer 36 can be equal to the thickness of each second dry film 34.

As shown in FIG. 4L, each second dry film 34 of FIG. 4K is removed by separation liquid thereby to form a connection portion 40 electrically connected to the first metal film 23 and composed of the first connection portion 27 and the second connection portion 37.

A diameter 37a of the second connection portion 37 is preferably formed to be smaller than a diameter 27a of the first connection portion 27 in order to more easily form the second connection portion 37 on the surface of the first connection portion 27 at the time of a plating process.

That is, the connection portion 40 is formed at an outer surface of the first connection portion 27 exposed through the second plate opening 32 by an electrolytic electroplating process. At this time, in case that the diameter of the second plate opening 32 is smaller than the diameter of the first connection portion, the connection portion 40 can be easily formed even if an error is generated at the time of an electrolyte electroplating process, that is, even if the second plate opening 32 is not precisely positioned at the center line of the first connection portion 27.

As shown in FIG. 4M, like in FIG. 4F, a second insulating member 48', a third passivation film 49, and a fourth passivation film 49' are sequentially lamintated on the surface of each first insulating layer 28 thereby to form a lamination body 41. As a material of the second insulating member 48', a polyimide resin or a prepreg can be used.

The process for heating and pressurizing the lamination body 41 at the outer surface of the second insulating layer 28 is almost the same as the process aforementioned in FIGS. 4F to 4H.

That is, the laminated body 41 is positioned at a pressing device (not shown), and is heated and pressurized. According to this, the second insulating member 48' is partially softened between each second connection portion 37, and the second connection portion 37 penetrates the second insulating member 48' thereby to form a second insulating layer 48 as shown in FIG. 4N.

As shown in FIG. 4N, the fourth passivation film 49' is removed, and the second insulating layer 48 is planarized with a same height of the second insulating member 48' by a grinding.

The third passivation film 49 protects the second insulating layer 48 at the time of a grinding process. The fourth passivation film 49' uniformly transmits a pressing force of a pressing device to the second insulating member 48'. That is, when the device (not shown) presses the lamination body 41, the end of the second connection portion 37 is uniformly in contact with the second insulating member 48'. Under this state, the end of the second connection portion 37 easily penetrates the second insulating member 48', so that the second insulating layer 48 is uniformly filled between each second connection portion 37.

As shown in FIG. 4N, a second metal film 53 is formed on the surface of each second insulating layer 48 so as to be electrically connected to the second connection portion 37. The second metal film 53 is attached to both surfaces of the base member 20, that is, to the surfaces of the second insulating layer 48 to which the end of the connection portion 40 is exposed. That is, the second metal film 53 is attached to both surfaces of the base member 20, and then is heat-pressurized by a press. According to this, the ends of the second metal film 53 and the connection portion 40 are firmly connected to each other with a plastic deformation, so that the first metal film 23 and the second metal film 53 are electrically firmly connected to each other by the connection portion 40.

Then, both end portions of the releasing film 22 are cut in a vertical direction of the base member 20, a direction indicated as a cutting line 55, so that each first metal film 23 is divided into an upper metal film and a lower metal film on the basis of the center layer 21. According to this, two printed circuit boards 60 and 60' just prior to a completion are formed.

As the final process as shown in FIG. 4O, a specific part of each second metal film 53 of FIG. 4N is removed thereby to form copper patterns 65 to be electrically connected to the connection portion 40 on the surface of each second insulating layer 48. According to this, two printed circuit boards 60 and 60' are completed.

Another embodiment of the process for heating and pressurizing each lamination body 41 on the surface of the first insulating layer 28 will be explained with reference to FIGS. 5A to 5C.

Figure 5A:
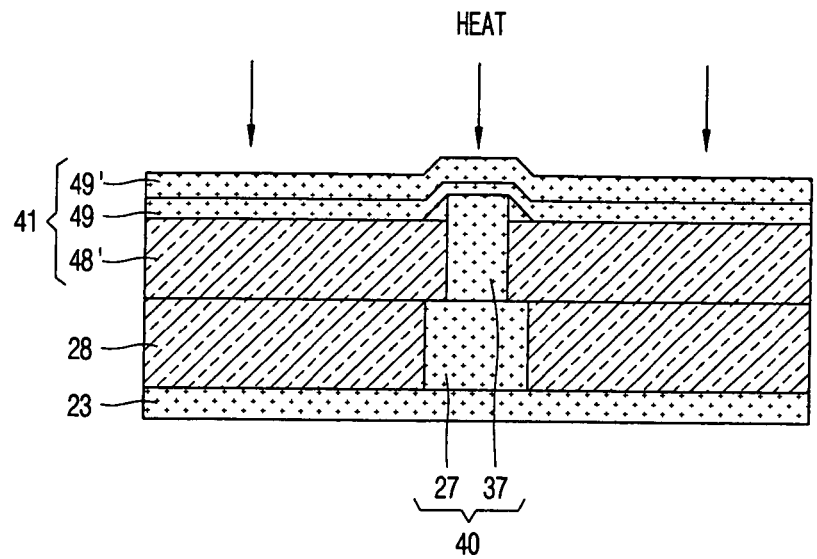
FIGS. 5A to 5C are flow charts showing another embodiment of a process for heating and pressurizing a laminated body on a surface of a first insulating layer in the fabricating method for the multi-layer printed circuit board according to the present invention.
Figure 5B:
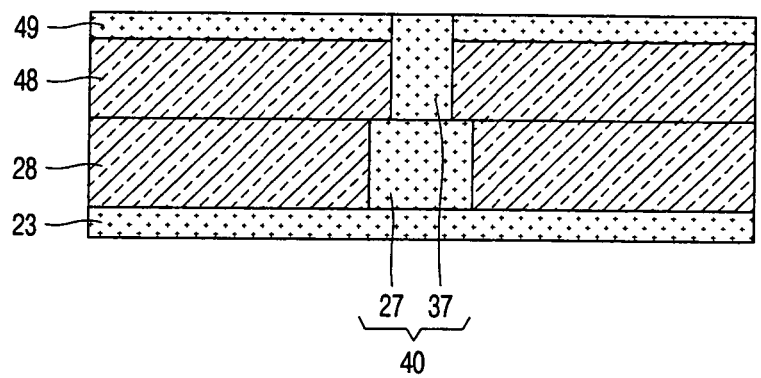
Figure 5C:
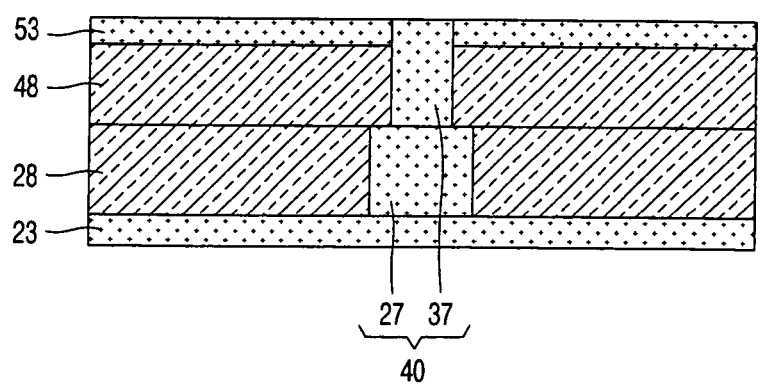

FIG. 5A is a flow chart showing a process for forming a lamination body by sequentially laminating a second insulating member, a third passivation film, and a fourth passivation film on the surface of the first insulating layer, and then heating and pressurizing the lamination body, FIG. 5B is a flow chart showing a process for removing the fourth passivation film by separation liquid and then grinding the third passivation film so that a height of the third passivation film can be same as a height of a second connection portion, and FIG. 5C is a flow chart showing a process for heat-pressurizing a second metal film on the second connection portion.

As shown in FIG. 5A, a second insulating member 48', a third passivation film 49, and a fourth passivation film 49' are sequentially laminated on a first insulating layer 28 thereby to form a lamination body 41. Then, the lamination body 41 is positioned at a pressing device (not shown), and then is heated and pressurized. According to this, the second insulating member 48' is partially softened between each second connection portion 37, and the second connection portion 37 penetrates the second insulating member 48' thereby to form a second insulating layer 48 of FIG. 5B. Then, the fourth passivation layer 49' is removed by separation liquid, and the third passivation layer 49 is planarized so that the height of the third passivation layer 49 can be same as the height of the second connection portion 37. The third passivation film 49 protects the second insulating layer 48 at the time of a grinding process.

The second passivation film 29' uniformly transmits a pressing force of a pressing device to the first insulating member 28'. That is, when the device (not shown) presses the lamination body 30, the end of the first connection portion 27 is uniformly in contact with the first insulating member 28'. Under this state, the end of the first connection portion 27 easily penetrates the first insulating member 28', so that the first insulating layer 28 is uniformly filled between each first connection portion 27.

If each second connection portion 37 does not have the same height, a pressing process is performed under a state that the end of each second connection portion 37 does not uniformly contact each second insulating member 48'. According to this, only the relatively higher second connection portion 37 penetrates the second insulating member.48 and the relatively lower second connection portion 37 does not penetrate the second insulating member 48'. Therefore, it is preferable to adjust each second connection portion 37 as the same height.

As shown in FIG. 5C, the fourth passivation film of FIG. 5B is removed, and a second metal film 53 is heat-pressurized on the surface of the second insulating layer 48 thereby to electrically connect the second metal film 53 and the connection portion 40.

Hereinafter, a fabricating method for a multi-layer printed circuit board according to another embodiment of the present invention will be explained.

First, a double-type connection portion composed of a first connection portion and a second connection portion is formed by using a dry film, a plating resist, and then the dry film is removed thereby to completely expose the connection portion to the outside with a first metal film.

Under this state, an insulating member is heat-pressurized between the connection portion thereby to form an insulating layer, and the connection portion and the insulating layer are ground to have the same height. Then, a second metal film is adhered to the surface of the insulating layer thereby to electrically connect the first metal film and the second metal film each other through the connection portion. Then, the base member is divided into two thus to form circuit patterns, thereby forming two printed circuit boards.

As aforementioned, in the present invention, the copper patterns formed at the upper and lower surfaces of the printed circuit board and the connection portion for electrically connecting the copper patterns can be formed more easily and simply, and a workability and a production yield can be increased.

Also, since the center layer formed of a prepreg film is formed at the center of the base member, the intensity of the base member can be maintained at the time of fabricating the printed circuit board. According to this, the base member can be dealt with more easily, and two printed circuit boards can be simultaneously fabricated at both surfaces of the base member thereby to enhance the productivity at least two times than in the conventional art.

Additionally, since the connection portion for electrically connecting the circuit patterns formed at the upper and lower surfaces of the printed circuit board is formed by an electroplating process, a material loss is less than that by a screen printing method or an etching and the intensity of the connection portion becomes great.

Also, the connection portion is composed of the first connection portion and the second connection portion integrally plated with the first connection portion, and the diameter of the first connection portion is different from the diameter of the second connection portion, thereby facilitating to form the connection portion.

Also, since the plate protrusion is removed by a grinding process, the dry film can be easily removed.

Additionally, since a plurality of the passivation films are used in forming the insulating layer between each connection portion, the insulating layer can be formed more easily and precisely and thereby the adhesive property of the metal film can be increased.

As the present invention may be embodied in several forms without departing from the spirit or essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within the metes and bounds of the claims, or equivalence of such metes and bounds are therefore intended to be embraced by the appended claims.

What is claimed is:

1. A method for fabricating a multi-layer printed circuit board (PCB), comprising:
   attaching a releasing film to both an upper and a lower surface of a center layer, attaching a first metal film to the releasing film, and attaching a first dry film to a surface of each first metal film, thereby forming a base member;
   forming a first connection portion on the first metal film by an electroplating process, comprising:
      selectively removing portions of each first dry film, thereby exposing corresponding portions of each first metal film to form first plate openings;
      forming a first plate layer on the corresponding portions of each first metal film exposed through the first plate opening of each first dry film such that each first plate layer is electrically connected to its corresponding first metal film;
      grinding each first plate layer to a predetermined thickness; and
      removing each first dry film, thereby forming a first connection portion from each first plate layer;
   laminating an insulating material on the surface of each first metal film where each first connection portion is formed, and then heating and pressuring the insulating material, thereby forming a first insulating layer at each first connection portion;
   forming a second connection portion on a surface of the first connection portion by an electroplating process, thereby forming an integral connection portion from the first connection portion and the second connection portion, comprising:
      depositing a second dry film on a surface of each first insulating layer;
      selectively removing portions of each second dry film corresponding to the first connection portions, thereby forming a second plate opening in each second dry film;
      forming a second plate layer at an end of each first connection portion exposed through the second plate opening;
      grinding each second plate layer to a predetermined thickness; and
      removing each second dry film, thereby forming a second connection portion, each corresponding first and second connection portion forming an integral connection portion;
   laminating an insulating material on a surface of each first insulating layer and then forming a second insulating layer through which each connection portion protrudes;
   forming a second metal film on each second connection portion such that each second metal film is electrically connected to its corresponding first metal film via a corresponding integral connection portion;

cutting both end portions of the base member in a vertical direction at a position inside of an outer edge of the releasing films, thereby releasing the first metal layers from the releasing films to form first and second printed circuit boards; and selectively removing portions of each second metal film, thereby forming copper patterns on a surface of each second insulating layer such that each copper pattern is electrically connected to its corresponding connection portion.

2. The method of claim 1, wherein a length of each releasing film is less than a length of the center layer.

3. The method of claim 1, wherein a diameter of each second connection portion is smaller than a diameter of a corresponding first connection portion.

4. The method of claim 1, further comprising leveling a top surface of the second connection portion to a same height as the insulating member after pressing the first connection portion and second connection portion into the insulating member.

5. The method of claim 1, wherein the first and second connection portions form a staged connection portion whose base portion is larger than its upper portion between the first and second metal layers.

* * * * *